United States Patent
Watanabe et al.

(10) Patent No.: US 11,271,534 B2
(45) Date of Patent: Mar. 8, 2022

(54) VARIABLE GAIN CIRCUIT, HIGH FREQUENCY SWITCH, AND TRANSISTOR CIRCUIT

(71) Applicant: Murata Manufacturing Co., Ltd., Kyoto (JP)

(72) Inventors: Daisuke Watanabe, Kyoto (JP); Takayuki Tomita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 91 days.

(21) Appl. No.: 16/892,657

(22) Filed: Jun. 4, 2020

(65) Prior Publication Data

US 2020/0389141 A1 Dec. 10, 2020

(30) Foreign Application Priority Data

Jun. 4, 2019 (JP) .............................. JP2019-104517

(51) Int. Cl.
*H03F 3/14* (2006.01)
*H03G 3/18* (2006.01)
(Continued)

(52) U.S. Cl.
CPC ............... *H03G 3/18* (2013.01); *H03F 3/193* (2013.01); *H03F 3/21* (2013.01); *H03F 3/62* (2013.01); *H04B 1/40* (2013.01)

(58) Field of Classification Search
CPC ...... H03G 3/18; H03G 1/0088; H03G 1/0029; H03G 3/3036; H03F 3/62; H03F 3/21; H03F 3/193; H03F 2200/111; H03F 3/72; H03F 2200/451; H03F 2203/7209; H03F 3/245; H03F 3/601; H03F 1/565;
(Continued)

(56) References Cited

U.S. PATENT DOCUMENTS 3,519,765 A * 7/1970 Huber ....................... H03F 3/62
455/84
4,590,437 A * 5/1986 Butler ................... H03F 3/1935
330/269
(Continued)

FOREIGN PATENT DOCUMENTS

JP H09-505450 A 5/1997
JP H09-162662 A 6/1997

*Primary Examiner* — Khanh V Nguyen
(74) *Attorney, Agent, or Firm* — Pearne & Gordon LLP

(57) ABSTRACT

A variable gain circuit includes: input/output terminals P1 and P2 configured to input/output a high frequency signal; a transistor having a signal terminal "a" connected to the input/output terminal P1, a signal terminal "b" connected to the input/output terminal P2, and a control terminal; bias terminals B1, B2 and B3, and a reference voltage terminal respectively set to a first variable voltage, a second variable voltage, a third variable voltage, and a fixed voltage that are independent of one another; an impedance element connected between the bias terminal B1 and the signal terminal a; an impedance element connected between the bias terminal B2 and the signal terminal b; an impedance element connected between the bias terminal B3 and the control terminal; and a first switch configured to switch between connecting and not connecting the reference voltage terminal and the control terminal.

19 Claims, 5 Drawing Sheets

(51) Int. Cl.
*H03F 3/62* (2006.01)
*H03F 3/21* (2006.01)
*H03F 3/193* (2006.01)
*H04B 1/40* (2015.01)

(58) Field of Classification Search
CPC ......... H03F 3/195; H04B 1/40; H04B 1/0458; H03H 11/245
See application file for complete search history.

(56) References Cited

U.S. PATENT DOCUMENTS

| | | | | |
|---|---|---|---|---|
| 5,006,823 A * | 4/1991 | Baril | ...................... | H03C 7/025 327/231 |
| 5,057,791 A * | 10/1991 | Thompson | ............ | H03F 3/1935 330/277 |
| 5,191,338 A * | 3/1993 | Katz | ...................... | H03F 1/3241 330/277 |
| 5,821,813 A * | 10/1998 | Batchelor | ................ | H03F 3/62 330/277 |
| 6,307,436 B1 * | 10/2001 | Hau | ...................... | H03F 1/0238 330/149 |
| 6,933,780 B2 * | 8/2005 | Fujiwara | ............... | H03F 1/3276 330/149 |
| 7,783,266 B2 * | 8/2010 | Hosokawa | ........... | H03D 7/1458 455/84 |

* cited by examiner

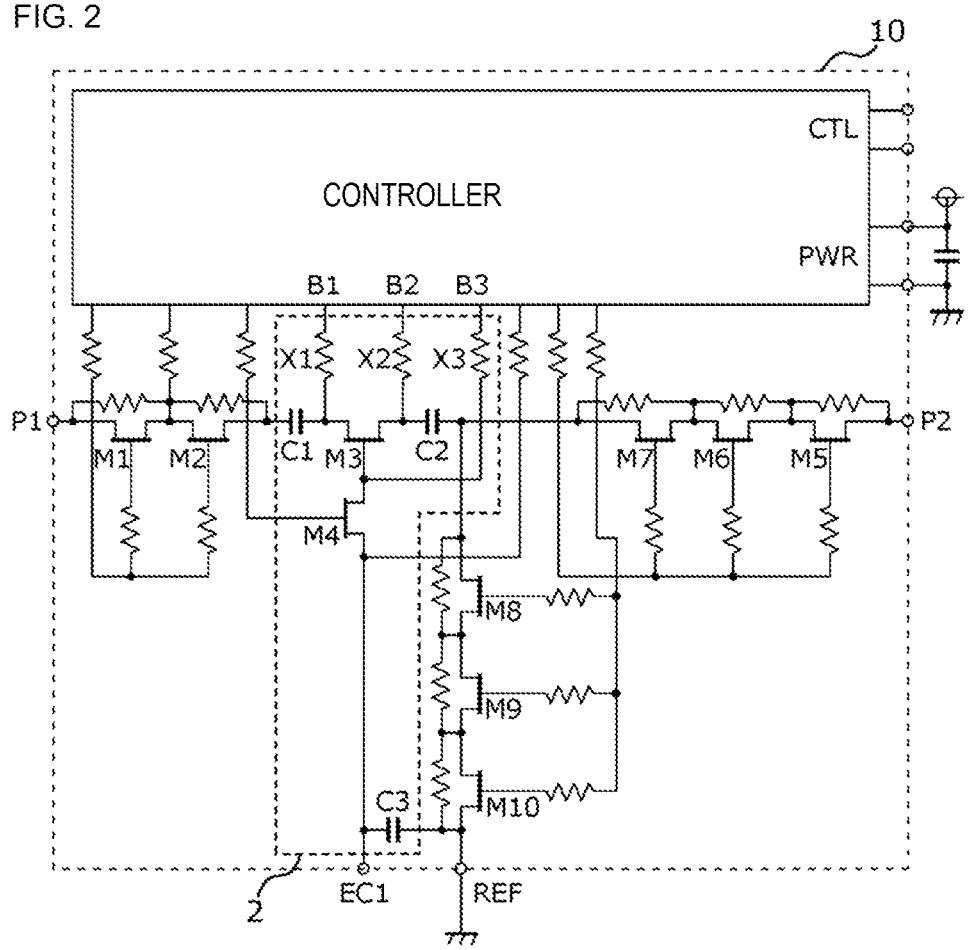

(12) United States Patent

VARIABLE GAIN CIRCUIT, HIGH FREQUENCY SWITCH, AND TRANSISTOR CIRCUIT

This application claims priority from Japanese Patent Application No. 2019-104517 filed on Jun. 4, 2019. The content of this application is incorporated herein by reference in its entirety.

BACKGROUND

The present disclosure relates to a variable gain circuit, a high frequency switch, and a transistor circuit.

A variable gain circuit has been well-known in which there are provided a signal path where a gain is given via an amplifier, a signal path where an amplifier is not involved, and two single-pole double-throw (SPDT) switches, and any one of the signal paths is connected between input/output terminals via the two SPDT switches (for example, see FIG. 9 in Japanese Unexamined Patent Application Publication No. 9-162662).

According to the above-described variable gain circuit, such a variable gain circuit is achieved that has two kinds of gains, that is, a gain of 0 dB by a signal path with no amplifier involved, and a gain based on a predetermined amplification factor set for the amplifier.

The variable gain circuit described above requires a plurality of components including at least the amplifier and two SPDT switches, and thus the circuit tends to be large in size. Further, without necessarily additional components being provided, it is impossible to perform a bidirectional amplification operation, and also impossible to perform an operation of switching between flowing and cutting off a signal toward the variable gain circuit in accordance with a request from the variable gain circuit.

BRIEF SUMMARY

The present disclosure provides a variable gain circuit that is small in size, is able to perform a bidirectional amplification operation, and is able to perform an operation of switching between flowing and cutting off a signal.

A variable gain circuit according to an aspect of the present disclosure includes: a first input/output terminal and a second input/output terminal configured to input/output a high frequency signal; a transistor having a first signal terminal connected to the first input/output terminal, a second signal terminal connected to the second input/output terminal, and a control terminal; a first bias terminal, a second bias terminal, a third bias terminal, and a reference voltage terminal respectively set to a first variable voltage, a second variable voltage, a third variable voltage, and a fixed voltage that are independent of one another; a first impedance element connected between the first bias terminal and the first signal terminal; a second impedance element connected between the second bias terminal and the second signal terminal; a third impedance element connected between the third bias terminal and the control terminal; and a first switch configured to switch between connecting and not connecting the reference voltage terminal and the control terminal.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 2 is a circuit diagram illustrating an example of a configuration of a high frequency switch according to a second embodiment;

DETAILED DESCRIPTION

A plurality of embodiments of the present disclosure will be described in detail with reference to the accompanying drawings. Any of the plurality of embodiments described below represents a general or specific example. Numerical values, shapes, materials, constituent elements, arrangement and connection forms of the constituent elements, and the like indicated in the following embodiments are mere examples and are not intended to be limited to the present disclosure.

In the following embodiments, the description of "connect" means connecting two or more subjects or portions of the subjects to each other directly or with at least one connecting material, such as a component or more, a circuit element, solder, or the like interposed therebetween.

First Embodiment

A variable gain circuit according to a first embodiment will be described by citing an example of a variable gain circuit that is small in size, is able to perform an on operation and an off operation as a switch, and is able to perform a bidirectional amplification operation.

Figure 1A:
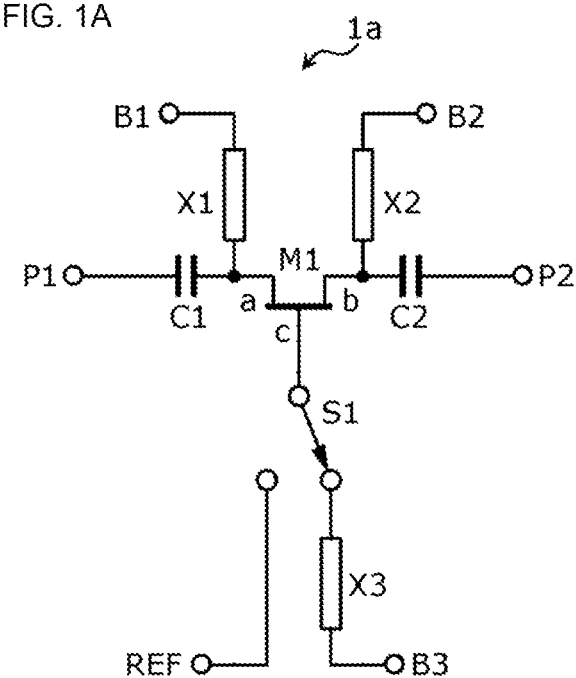
FIG. 1A is a circuit diagram illustrating an example of a configuration of a variable gain circuit according to a first embodiment.

FIG. 1A is a circuit diagram illustrating an example of a configuration of a variable gain circuit according to the first embodiment. As illustrated in FIG. 1A, a variable gain circuit 1a includes input/output terminals P1 and P2, a transistor M1, bias terminals B1, B2 and B3, a reference voltage terminal REF, impedance elements X1, X2 and X3, capacitors C1 and C2, and a switch S1.

The input/output terminals P1 and P2 input/output high frequency signals.

The transistor M1 includes signal terminals a and b, and a control terminal c. When the transistor M1 is formed of a field effect transistor (FET), the signal terminals a and b correspond to one and the other one of the source and the drain, respectively, and the control terminal c corresponds to a gate.

The signal terminal a is connected to the input/output terminal P1 via the capacitor C1 for blocking DC voltage, and the signal terminal b is connected to the input/output terminal P2 via the capacitor C2 for blocking DC voltage.

The bias terminals B1, B2 and B3, and the reference voltage terminal REF are respectively set to a first variable voltage, a second variable voltage, a third variable voltage, and a fixed voltage that are independent of one another, by a bias circuit (not illustrated). The voltages set to the bias terminals B1, B2 and B3, and the reference voltage terminal REF, may be a ground voltage or may be other voltages, for example.

The variable voltages mean that the transistor M1 is able to change and set the voltages to predetermined bias voltages required to perform a switch-on operation, a switch-off operation, and an amplification operation for a desired gain in a desired direction, which will be described later. Depending on the design, while enabling all these operations, the bias terminal B3 and/or the reference voltage terminal REF may be set to a fixed voltage all the time, for example.

The impedance element X1 is connected between the bias terminal B1 and the signal terminal a, the impedance element X2 is connected between the bias terminal B2 and the signal terminal b, and the impedance element X3 is connected between the bias terminal B3 and the control terminal c. The impedance elements X1, X2, and X3 may be resistors or inductors.

The switch S1 is an SPDT switch connected to the control terminal c. The switch S1 selectively connects the control terminal c and any one of the reference voltage terminal REF and the impedance element X3. In other words, the switch S1 is an example of a first switch configured to switch between connecting and not connecting (selectively connect) the control terminal c and the reference voltage terminal REF.

The variable gain circuit 1a may be formed in an integrated circuit (IC) for a high frequency. A bias circuit (not illustrated) may be further formed in the IC in which the variable gain circuit 1a is formed.

The variable gain circuit 1a is able to perform four operations including the switch-off operation, the switch-on operation, a forward-direction amplification, and a reverse-direction amplification in accordance with the settings of the bias voltages.

The switch-off operation is an operation to cause the transistor M1 to function as a switch in an off state so as to block transmission of a signal between the input/output terminals P1 and P2. The switch-on operation is an operation to cause the transistor M1 to function as a switch in an on state so as to transmit a signal between the input/output terminals P1 and P2 with a lower gain (for example, no gain) than that in an amplification operation.

The forward-direction amplification operation is an operation to cause the transistor M1 to function as a common-gate amplifier, so as to amplify a signal supplied to the input/output terminal P1 and output the amplified signal from the input/output terminal P2. The reverse-direction amplification operation is an operation to cause the transistor M1 to function as a common-gate amplifier, so as to amplify a signal supplied to the input/output terminal P2 and output the amplified signal from the input/output terminal P1.

Table 1 indicates control conditions corresponding to the four operations of the variable gain circuit 1a.

TABLE 1

| Operation  | S1 | B1             | B2             | B3             | P1              | P2              |
|------------|----|----------------|----------------|----------------|-----------------|-----------------|
| Switch-off | B3 | High potential | High potential | Low potential  | Input/Output    | Input/Output    |
| Switch-on  | B3 | Low potential  | High potential | High potential | Input/Output    | Input/Output    |

TABLE 1-continued

| Operation                         | S1  | B1             | B2             | B3       | P1     | P2     |
|-----------------------------------|-----|----------------|----------------|----------|--------|--------|
| Forward-direction amplification   | REF | Low potential  | High potential | Optional | Input  | Output |
| Reverse-direction amplification   | REF | High potential | Low potential  | Optional | Output | Input  |

In the switch-off operation and the switch-on operation, the control terminal c is connected to the bias terminal B3 via the switch S1 and the impedance element X3. The bias terminals B1, B2, and B3 are each set, in accordance with Table 1, to a higher bias voltage (high potential) or a lower bias voltage (low potential) in the comparison between the voltages set to the respective terminals. With this, the switch-off operation and the switch-on operation are performed.

A difference in potential between the bias terminals B1, B2 and the bias terminal B3 required to obtain cut-off characteristics in the switch-off operation is larger in a case of using a depletion type FET than in a case of using an enhancement type FET for the transistor M1. Therefore, when a depletion type FET is used for the transistor M1, the bias terminal B3 may be set to a negative potential (i.e., a negative bias) in the switch-off operation.

In the forward-direction amplification operation and the reverse-direction amplification operation, the control terminal c is connected to the reference voltage terminal REF via the switch S1. The bias terminals B1 and B2 are set, in accordance with Table 1, to any one of a higher bias voltage (high potential) and a lower bias voltage (low potential) in the comparison between the voltages.

When the bias terminal B1 is set to a low potential and the bias terminal B2 is set to a high potential, the signal terminal a serves as a source and the signal terminal b serves as a drain, so that the forward-direction amplification operation is performed. When the bias terminal B1 is set to a high potential and the bias terminal B2 is set to a low potential, the signal terminal b serves as the source and the signal terminal a serves as the drain, so that the reverse-direction amplification operation is performed.

As described above, the variable gain circuit 1a is able to perform on and off operations as a switch between the input/output terminals P1 and P2, and is also able to perform a bidirectional amplification operation between the input/output terminals P1 and P2, by using the single transistor M1.

More specifically, when an appropriate bias voltage of high potential is applied to the drain and an appropriate bias voltage of low potential is applied to the source, and the base is fixed to an appropriate reference potential, that is, the base is AC-grounded, an appropriate bias current flows from the drain to the source, thereby making it possible to obtain an appropriate gain from the source to the drain, that is, obtain transconductance. This makes it possible to perform an amplification operation in which the source is taken as input and the drain is taken as output.

By switching the high and low levels of the bias potentials at the bias terminals B1 and B2 so as to set these terminals to appropriate potentials, and fixing the base to an appropriate reference potential, that is, AC-grounding the base, the input and the output are switched, so that a bidirectional amplification operation may be performed.

As described above, in the variable gain circuit 1a, since a switch and a bidirectional amplifier are achieved by the single transistor M1, it is possible to reduce the number of amplifiers and the number of switching circuits. In addition to making it possible to reduce the number of transistors, it is possible to reduce, in accordance with the reduction in number of the transistors, the numbers of large-capacitance DC blocking capacitors and inductors for supplying the biases, which occupy a large area particularly when formed in an IC, so that it is possible to miniaturize the circuit.

As a result, the variable gain circuit that is small in size, is able to perform the on and off operations as a switch, and is able to perform the bidirectional amplification operation is achieved.

In the forward-direction amplification operation and the reverse-direction amplification operation, since the transistor M1 functions as a common-gate amplifier, an input impedance is low, and the matching with a signal of a characteristic impedance of about 50Ω may be obtained over a wide band. This makes it possible to obtain input matching over a wide band.

In the transistor M1, the structure and electrical characteristics between the drain and the source have a high level of symmetry in order to obtain symmetry of the switching operation. As an example of the high level of symmetry, it is cited that the source and the drain of the transistor M1 are formed substantially in line symmetry with the gate interposed therebetween, and that the electrical characteristics of the source and the electrical characteristics of the drain are approximately the same. This makes it possible to obtain the electrical characteristics excellent in symmetry in the forward-direction amplification operation and in the reverse-direction amplification operation.

Figure 1B:
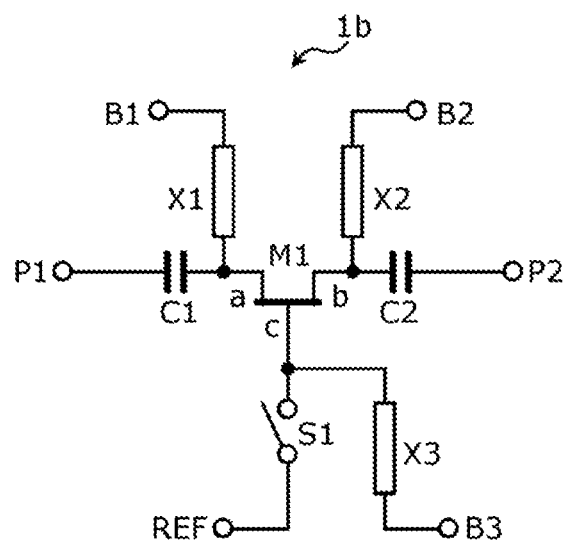
FIG. 1B is a circuit diagram illustrating another example of a configuration of a variable gain circuit according to the first embodiment.

Note that, in the variable gain circuit 1a illustrated in FIG. 1A, there is cited an example in which an SPDT switch is used as the switch S1, but the switch S1 may be a single-pole single-throw (SPST) switch as illustrated in FIG. 1B. A variable gain circuit 1b illustrated in FIG. 1B is different from the variable gain circuit 1a illustrated in FIG. 1A in that the switch S1 is an SPST switch and that the bias terminal B3 and the impedance element X3 are always connected to a location between the switch S1 and the control terminal c of the transistor M1.

Also, in the variable gain circuit 1b of FIG. 1B, the switch S1 functions as a first switch configured to switch between connecting and not connecting the control terminal c and the reference voltage terminal REF. Specifically, in the switch-off operation and the switch-on operation, the switch S1 is in an off state, and the control terminal c is connected to the bias terminal B3 via the impedance element X3. Also, in the forward-direction amplification operation and the reverse-direction amplification operation, the switch S1 is in an on state, and the control terminal c is connected to the reference voltage terminal REF via the switch S1. With the above circuit configuration, similarly to the variable gain circuit 1a, it is possible to achieve the variable gain circuit 1b, which is small in size, is able to perform the on and off operations as a switch, and is able to perform the bidirectional amplification operation.

In the following embodiments, an example in which a variable gain circuit equipped with the SPST switch illustrated in FIG. 1B is used, will be described.

Second Embodiment

In a second embodiment, a high frequency switch using a variable gain circuit will be described while citing an example of a high frequency switch serving as an SPST switch.

FIG. 2 is a circuit diagram illustrating an example of a configuration of a high frequency switch according to the second embodiment. As illustrated in FIG. 2, a high frequency switch 10 is provided with a first series section including a three-stage stack of transistors M1, M2 and M3, a shunt section including a three-stage stack of transistors M8, M9 and M10, a second series section including a three-stage stack of transistors M5, M6 and M7, and a controller.

In the high frequency switch 10, a variable gain circuit 2 is configured by using the transistor M3 among the transistors M1, M2, and M3 configuring the first series section. That is, the transistor M3 operates as a switch and also operates as a bidirectional amplifier. The transistors other than the transistor M3 each operate only as a switch.

The variable gain circuit 2 of FIG. 2 is different from the variable gain circuit 1b of FIG. 1B in that the transistor M4 is used as a switch for AC-grounding the gate of the transistor M3, a capacitor C3 is connected between the transistor M4 and a reference voltage terminal REF, and resistors are used as impedance elements X1 to X3.

In the variable gain circuit 2, when the transistor M4 is in the on state, the gate of the transistor M3 is connected to the reference voltage terminal REF via the capacitor C3 so as to be AC-grounded, so that the transistor M3 operates as an amplifier. Further, a terminal EC1 that is able to connect a bypass capacitor at an outside for the gate of the transistor M3, in addition to the capacitor C3, is provided.

The controller has a function of controlling an on operation and an off operation of the high frequency switch 10 as an SPST switch, and controlling the amplification direction and the amplification factor of the transistor M3 as an amplifier.

That is, the potential of the gate of the transistor M3 can be set to a plurality of potentials; as a higher potential, a first amplification mode in which magnitude of a bias current between the drain and the source is larger and the gain is also large may be selected, and as a lower potential, a second amplification mode in which the magnitude of the bias current between the drain and the source is smaller and the gain is small may be selected. The selection is performed in accordance with a control signal CTL supplied from the outside by serial communication.

Each of two or more transistors in the high frequency switch may configure a variable gain circuit. In other words, two or more transistors configured to operate as switches and also operate as bidirectional amplifiers may be provided in the high frequency switch.

Figure 3:
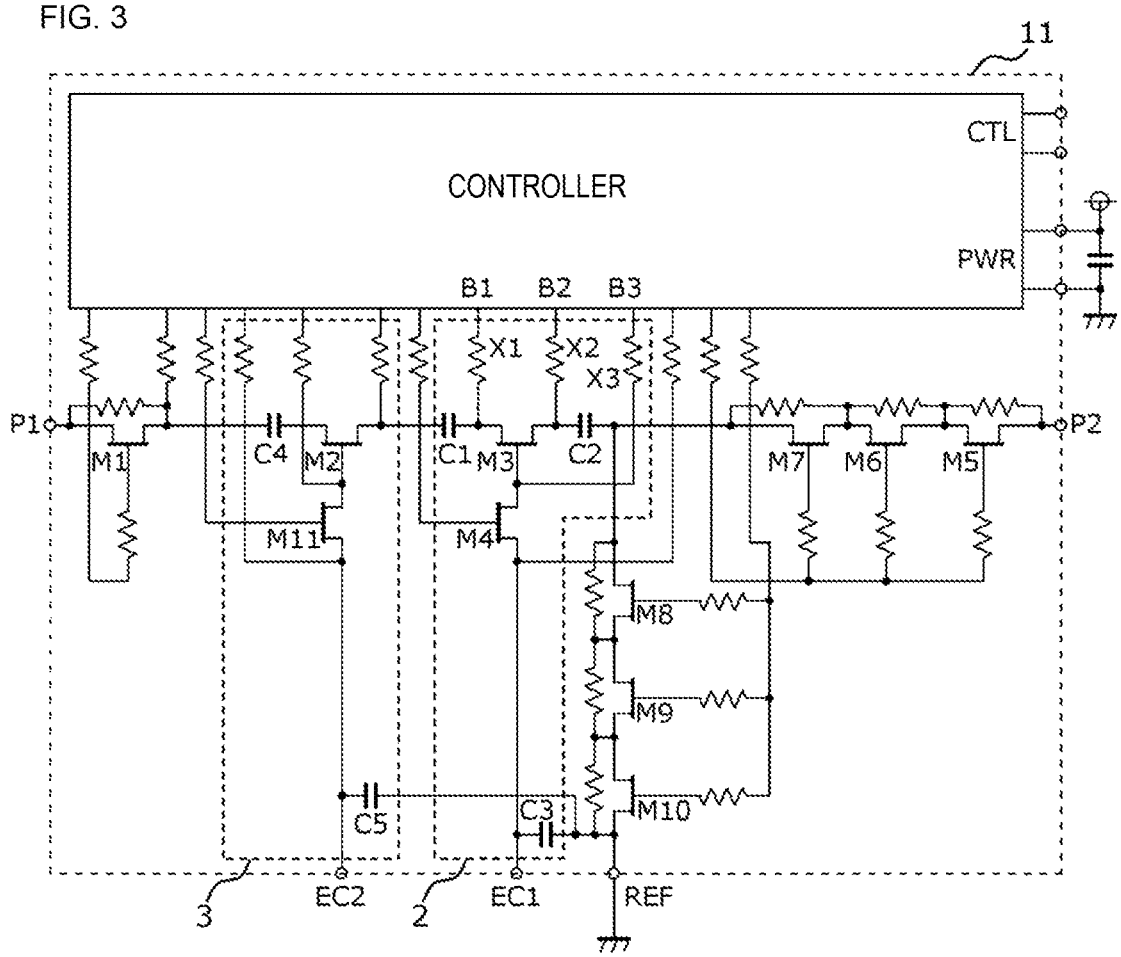
FIG. 3 is a circuit diagram illustrating another example of a configuration of a high frequency switch according to the second embodiment.

FIG. 3 is a circuit diagram illustrating another example of a configuration of a high frequency switch according to the second embodiment. A high frequency switch 11 illustrated in FIG. 3 is different from the high frequency switch 10 illustrated in FIG. 2 in that a variable gain circuit 3 using the transistor M2 is configured in addition to the variable gain circuit 2 using the transistor M3.

With the high frequency switches 10 and 11 configured as described above, the same effects as those described in the first embodiment may be obtained in the variable gain circuits 2 and 3, and additionally the following effects may be obtained.

The high frequency switches 10 and 11 each includes the first series section, the shunt section, and the second series section; accordingly, by causing the shunt section, when the entire high frequency switch is in the off state, to be in the on state, a high level of isolation is obtained. Since the first series section, the shunt section, and the second series section are each configured to be a three-stage stack of three transistors cascade-connected to one another, the withstand voltage is improved. As a result, it is possible to cut off a signal of large power.

The transistor M3 in the high frequency switch 10, and the transistors M2, M3 in the high frequency switch 11 are each able to operate as a switch and an amplifier. Since the transistor that is able to operate as an amplifier is able to operate as one stage in the stack when the stated transistor operates as a switch, it is possible to maintain the withstand voltage in the entire high frequency switch without making it necessary to add an excessive stage. In other words, by adding an amplification function to one transistor or more among the plurality of transistors to be cascade-connected to one another, an increase in the number of transistors and the increase in an area of the transistors may be limited, so that the circuit may be reduced in size.

In the high frequency switches 10 and 11, the transistors M2 and M3 able to operate as switches and amplifiers are disposed at locations separate from the input/output terminals P1 and P2 with the transistor M1 interposed therebetween. To be specific, in an alignment where the transistors M2 and M3 able to operate as switches and amplifiers, and the other transistors M1 and M5 to M7 are cascade-connected to one another, the transistors M2 and M3 are disposed at the locations other than end portions (a location of the transistor M1 and a location of the transistor M5).

This makes it possible to cause the power (required withstand voltage) applied to the transistors M2 and M3 to be comparatively small, and therefore it is unnecessary to connect correction capacitance, which will be described later, between the drain and the source of each of the transistors M2 and M3.

In the common-gate amplifier, since the correction capacitance functions as positive feedback, there is a risk of causing unwanted oscillation when the correction capacitance is set to a constant amount of feedback, that is, a value equal to or larger than a constant amount of capacitance, but it is possible to stabilize the amplification operation in a case of operating as a bidirectional amplifier by configuring the correction capacitance value by minimum capacitance or only by distributed capacitance.

Further, by using resistors as the impedance elements X1 to X3, it is possible to achieve, while applying negative feedback to a DC bias current, a flow of a necessary bias current. In addition, since no AC frequency characteristics are present, it is possible to achieve a flow of a bias current required in a wide band.

By using a transistor as a switch for switching the functions of a transistor between a switch and an amplifier, it is possible to electronically control the switching of the functions. Since a large-power signal is not flowed in a transistor for switching the functions of other transistors and such a transistor does not need a large withstand voltage, it is possible to use a transistor small in size.

In a case where there are provided two or more transistors able to operate also as amplifiers, a common-gate amplifier circuit has an advantage that unwanted oscillation is unlikely to occur even when series connection of a plurality of stages is made, because the isolation from output toward input in the common-gate amplifier circuit is better than that of the common-source amplifier circuit and the common-drain amplifier circuit, that is, the unidirectionality is better.

By providing a connection terminal for an external bypass capacitor, it is possible to expand the operation band width for amplification action to a lower frequency range by connecting a capacitor as needed.

Since there exists the controller that is able to control the operation of the high frequency switch by serial communication, it is possible to easily perform complex control including a plurality of gain settings with limited terminals, that is, in a small-size shape.

Third Embodiment

In a third embodiment, a high frequency functional circuit using a variable gain circuit will be described while citing an example of a high frequency functional circuit including a bypass path.

Figure 4:
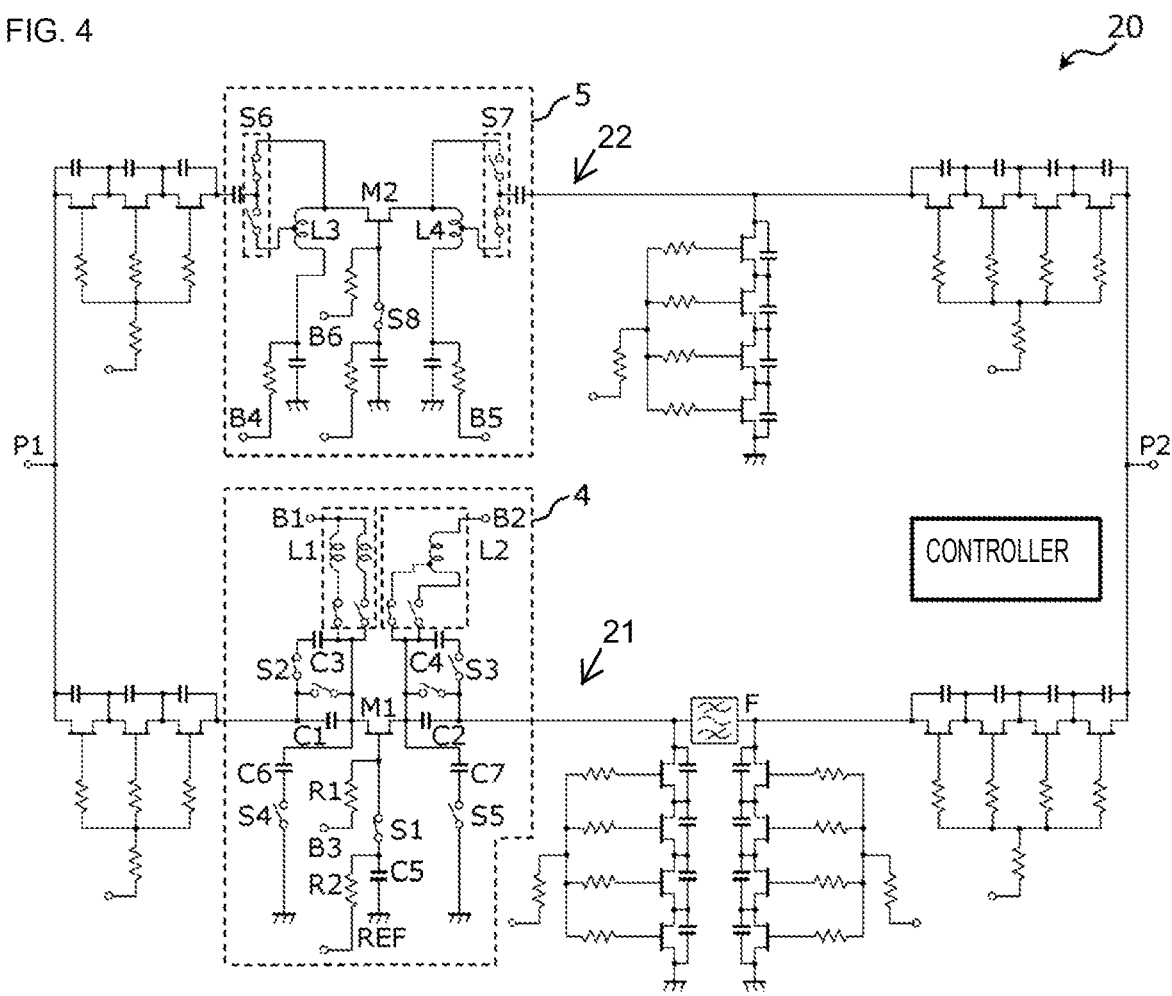
FIG. 4 is a circuit diagram illustrating an example of a configuration of a high frequency functional circuit according to a third embodiment.

FIG. 4 is a circuit diagram illustrating an example of a configuration of a high frequency functional circuit according to the third embodiment. In FIG. 4, only paths for transmitting high frequency signals are mainly described. The items whose features are described in the first and second embodiments are appropriately provided as long as there is no contradiction, and description thereof will be omitted.

As illustrated in FIG. 4, a high frequency functional circuit 20 includes a functional element F, a functional path 21 (on a lower side in FIG. 4) including the functional element F, and a bypass path 22 (on an upper side in FIG. 4), which bypasses the functional element F. The functional element F is not particularly limited, and may be, for example, a band pass filter. Each of the functional path 21 and the bypass path 22 is a high frequency switch configured in the same manner as the high frequency switch 10 of the second embodiment.

A variable gain circuit 4 is configured by using the transistor M1 included in the functional path 21, and a variable gain circuit 5 is configured by using the transistor M2 included in the bypass path 22. That is, the transistors M1 and M2 are able to operate as switches and are also able to operate as bidirectional amplifiers. Transistors (reference symbols thereof are omitted) other than the transistors M1 and M2 operate only as switches. A capacitor for correcting AC voltage distribution of a signal is connected between a source and a drain of each transistor configured to operate only as a switch.

Hereinafter, for the sake of convenience of description, a signal terminal on an input/output terminal P1 side of each of the transistors M1 and M2 is referred to as the source, and a signal terminal on an input/output terminal P2 side is referred to as the drain, while taking a forward-direction amplification operation as the reference.

In the functional path 21, a series circuit in which a switch S2 and a capacitor C3 are connected in series, is connected in parallel with a capacitor C1. Further, a series circuit in which a switch S3 and a capacitor C4 are connected in series, is connected in parallel with a capacitor C2. At the time of the forward-direction amplification operation of the transistor M1, the switch S2 is turned on, the capacitors C1 and C3 are connected in parallel, and the switch S3 is turned off.

An inductor L1 is a variable inductor able to select a plurality of inductors, and is connected between a bias terminal B1 and the source of the transistor M1. An inductor L2 is a variable inductor including one tap or more and being able to select a plurality of sections of the inductor, and is connected between a bias terminal B2 and the drain of the transistor M1.

A series circuit in which a capacitor C6 and a switch S4 are connected in series, is connected between the source of the transistor M1 and a ground terminal. A series circuit in which a capacitor C7 and a switch S5 are connected in series, is connected between the drain of the transistor M1 and the ground terminal. Here, the ground terminal is an example of a terminal that is set to a fixed voltage. The ground terminal is an example of a "fixed voltage terminal".

The inductors L1 and L2 are configured to form parallel resonance circuits having predetermined resonant frequencies together with distributed capacitance (not illustrated) between the source and a gate and distributed capacitance (not illustrated) between the drain and the gate, respectively. By turning on the switches S4 and S5, the capacitors C6 and C7 are connected in parallel with the distributed capacitance between the source and the gate and with the distributed capacitance between the drain and the gate, respectively.

In the bypass path 22, transformers that can be used for impedance conversion by tightly-coupled wiring wires are employed for inductors L3 and L4 configured to supply biases to the source and the drain of the transistor M2. A plurality of winding wires may be interleaved with one another in order to obtain a uniform tight coupling. In a forward-direction amplification operation of the transistor M2, a switch S6 is switched to a high impedance side and a switch S7 is switched to a low impedance side.

With the high frequency functional circuit 20 configured as described above, the same effects as those described in the first embodiment may be obtained in the variable gain circuits 4 and 5, and additionally the following effects may be obtained.

Even in a case where a bypass path is selected through which a signal is expected to pass with minimum insertion loss, it is possible to complement a gain when a slight gain is needed in such a case that the insertion loss is not sufficiently low.

Suitable matching may be obtained, return loss may be minimized, and the gain may be maximized or the insertion loss may be minimized.

Specifically, in the forward-direction amplification operation of the transistor M1 in the functional path 21, the switch S2 on the input side is set in the on state so that the capacitors C1 and C3 are connected in parallel to increase capacitance and obtain a low impedance, and a signal of a characteristic impedance of about 50Ω is directly connected to the source having a low input impedance, thereby making it possible to obtain the matching.

In accordance with the variable inductance of the inductor L1, the resonant frequency of a parallel resonance circuit by the inductor L1 and the distributed capacitance between the source and gate may be adjusted. The resonant frequency may be further adjusted by connecting the capacitor C6. This makes it possible to have a constant frequency selectivity with the frequency being variable.

By using this frequency selectivity, it is possible to attenuate unwanted waves outside the operation band of the functional element F (the pass band of the functional element F in a case where the functional element F is a filter) by making the parallel resonance circuit resonate at a selected predetermined frequency. Accordingly, for example, the amplification characteristics of the variable gain circuit 4 may be exhibited in the operation band of the functional element F, while the attenuation characteristics of the variable gain circuit 4 may be exhibited outside the operation band of the functional element F. Therefore, in particular, in a case where the functional element F is a filter, the filter characteristics of the functional element F may be complemented and improved by the variable gain circuit 4.

Further, by setting the switch S3 on the output side in the off state and using the capacitance of the capacitor C2 alone, it is possible to match with the characteristic impedance of about 50Ω from a relatively high output impedance of the drain.

In accordance with the variable inductance of the inductor L2, the resonant frequency of a parallel resonance circuit by the inductor L2 and the distributed capacitance between the drain and gate may be adjusted. The resonant frequency may be further adjusted by connecting the capacitor C7. This makes it possible to have a constant frequency selectivity with the frequency being variable.

By using this frequency selectivity, it is possible to attenuate unwanted waves outside the operation band of the functional element F (the pass band of the functional element F in a case where the functional element F is a filter) by making the parallel resonance circuit resonate at a selected predetermined frequency. Accordingly, for example, the amplification characteristics of the variable gain circuit 4 may be exhibited in the operation band of the functional element F, while the attenuation characteristics of the variable gain circuit 4 may be exhibited outside the operation band of the functional element F. Therefore, in particular, in a case where the functional element F is a filter, the filter characteristics of the functional element F may be complemented and improved by the variable gain circuit 4.

It is possible for the transistor M1 to perform a reverse-direction amplification operation by exchanging the settings on the right side and left side of the switches and bias potentials based on symmetry of the configuration of the variable gain circuit 4, and the same effects as those indicated in the description of the forward-direction amplification operation may also be obtained in the reverse-direction operation.

Additionally, in the bypass path 22, the transistor M2 performs a switch-on operation, a switch-off operation, a forward-direction amplification operation, and a reverse-direction amplification operation in accordance with bias voltages that are set to bias terminals B4, B5 and B6, and the state of a switch S8.

Inductors L3 and L4 for biasing the transistor M2 also serve as transformers usable for impedance conversion. The inductors L3 and L4 convert impedances in the source and the drain of the transistor M2, and simultaneously apply bias voltages to be set to the bias terminals B4 and B5, to the source and the drain of the transistor M2.

In the forward-direction amplification operation of the transistor M2, the switch S6 on the input side is switched to the high impedance side (specifically, a switch-on the upper side in FIG. 4 among the switches configuring the switch S6 is turned on, while a switch-on the lower side in FIG. 4 is turned off). With this, the inductor L3 is able to flow a bias current while having a high impedance as a high frequency choke with respect to a high frequency signal, and does not interfere with the signal, so that the signal of a characteristic impedance of about 50Ω is input to the source in a matching state.

In the inductor L4 on the output side, the switch S7 on the output side is switched to the low impedance side as the tap side (in other words, a switch-on the upper side in FIG. 4 among the switches configuring the switch S7 is turned off, while a switch-on the lower side in FIG. 4 is turned on). With this, the matching with the characteristic impedance of about 50Ω is obtained from a relatively high output impedance of the drain. Further, it is possible for the bias current of the drain to flow through the inductor L4.

As a result, the drain current flows from the bias terminal B5 through the inductor L4 into the drain of the transistor M2 (the right side end in FIG. 4), and the current flows from the source of the transistor M2 (the left side end in FIG. 4) and then flows out from the bias terminal B4 through the inductor L3. An input signal supplied from the input/output terminal P1 side changes the potential of the source, so that the bias current is changed and the transistor M2 exhibits amplification action.

With this, in particular, in the forward-direction amplification operation and the reverse-direction amplification operation, it is possible to secure a flow route of the bias current (de facto DC current) flowing through the transistor M2 by the inductors L3 and L4.

On both an input side and an output side, the inductors L3 and L4 are each able to operate as a high frequency choke and a transformer in a wide band. The transformer able to operate in a wide band is achieved by, for example, tightly coupling the winding wires.

It is possible for the transistor M2 to perform a reverse-direction amplification operation by exchanging the settings on the right side and left side of the switches and bias potentials based on the symmetry of the configuration of the variable gain circuit 5, and the same effects as those indicated in the description of the forward-direction amplification operation may also be obtained in the reverse-direction operation.

A capacitor for correcting AC voltage distribution of the signal is provided between the drain and the source of each of the transistors (transistors cascade-connected to the transistors M2 and M1) configured to operate only as switches. In other words, the capacitor for correction is connected in parallel to each of the transistors configured to operate only as switches. These transistors are stacked in multiple stages. Accordingly, the functional path 21 and the bypass path 22 are each excellent in withstand voltage as a high frequency switch.

Here, the transistors M1 and M2 able to operate as bidirectional amplifiers are disposed at the locations farthest from the input/output terminal P1. More specifically, the transistors M1 and M2 are disposed at the locations farthest from the input/output terminal P1 in a cascading connection circuit configured by the transistors M1 and M2, and the plurality of transistors that is cascade-connected to the transistors M1, M2 and operates only as switches. With this, it is possible to minimize the correction capacitance for the AC voltage distribution of signals to be connected in parallel to the transistors M1 and M2, or it is possible to configure the correction capacitance by only the distributed capacitance between the drain and the source of the transistors M1 and M2. In the example of FIG. 4, the correction capacitance is configured by only the distributed capacitance.

In the common-gate amplifier, since the correction capacitance functions as positive feedback, there is a risk of causing unwanted oscillation when the correction capacitance is set to a constant amount of feedback, that is, a value equal to or larger than a constant amount of capacitance, but it is possible to stabilize the amplification operation in a case of operating as a bidirectional amplifier by configuring the correction capacitance value by minimum capacitance or only by distributed capacitance.

Fourth Embodiment

In a fourth embodiment, a directional coupler using a variable gain circuit will be described while citing an example of a directional coupler including a switch for switching a coupling direction.

Figure 5:
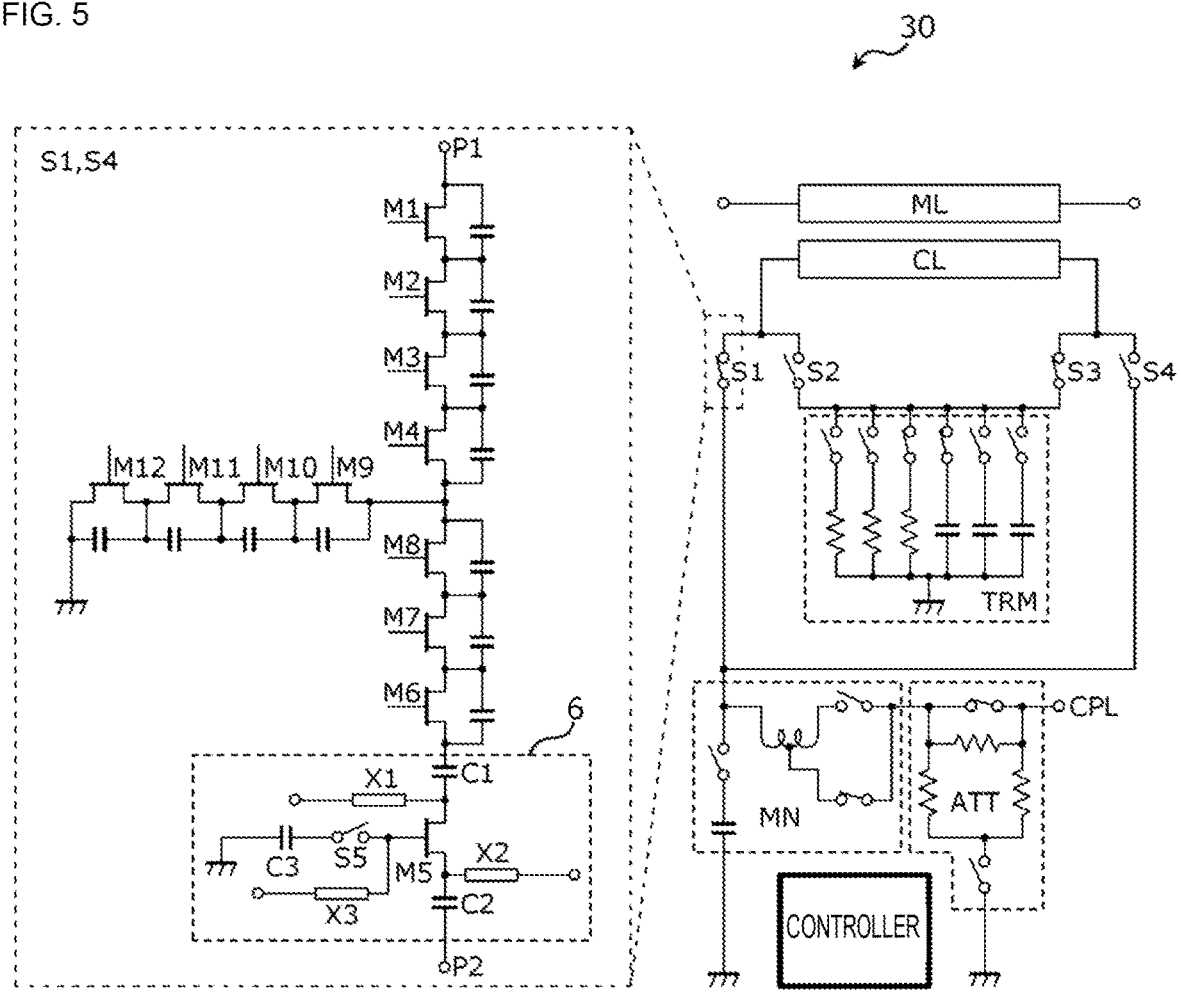
FIG. 5 is a circuit diagram illustrating an example of a configuration of a directional coupler according to a fourth embodiment.

FIG. 5 is a circuit diagram illustrating an example of a configuration of a directional coupler according to the fourth embodiment. The items whose features are described in the first, second, and third embodiments are appropriately provided as long as there is no contradiction, and description thereof will be omitted.

As illustrated in FIG. 5, a directional coupler 30 includes a main line ML, a sub-line CL, switches S1 to S4, a variable terminator TRM, a variable matching unit MN, and a variable attenuator ATT. Here, the switches S1 to S4 are examples of switches for switching a coupling direction. An example of a configuration of the switches S1, S4 is illustrated inside a dotted-line frame on the left side in FIG. 5.

Each of the switches S1 and S4 is a high frequency switch configured, similarly to the high frequency switch 10 of the second embodiment. To be specific, the switches S1 and S4 are each provided with a first series section including a four-stage stack of transistors M1, M2, M3 and M4, a shunt section including a four-stage stack of M9, M10, M11 and M12, and a second series section including a four-stage stack of transistors M5, M6, M7 and M8.

In the switches S1 and S4, a variable gain circuit 6 is configured by using the transistor M5 among the transistors M5, M6, M7, and M8 configuring the second series section. In other words, the transistor M5 operates as a switch and also operates as an amplifier. The transistors other than the transistor M5 each operate only as a switch.

In the switches S1 and S4, the transistor M5 is required to perform only a unidirectional amplification operation in which the upper side end in FIG. 5 is taken as input and the lower side end therein is taken as output, and there is no need for a bidirectional amplification operation.

With the directional coupler 30 configured as described above, the same effects as those described in the first embodiment may be obtained in the variable gain circuit 6, and additionally the following effects may be obtained.

When a coupling output of the directional coupler 30 is lower than desired, in a case where, for example, a degree of coupling measured on a lower frequency side in an operation band of the directional coupler 30 is low, or the input power itself to the directional coupler 30 is low, a larger degree of coupling is necessary. In such a case, it is possible to complement the degree of coupling by a gain of the variable gain circuit 6.

The degree of coupling of the directional coupler 30 itself may be adjusted to such magnitude that is able to obtain a necessary coupling output from the minimum input power assumed, but when the input power to the directional coupler 30 is sufficiently high, an unnecessary coupling output is obtained and consequently unnecessary loss is increased. As a result, in a battery-driven device, such as a mobile phone, consumption of the battery is accelerated.

In this regard, according to the directional coupler 30, the transistor M5 is able to operate as one stage of the stack configured to enhance a switch withstand voltage when the transistor M5 performs an off operation as a switch while performing operations in such a manner that an on operation as a switch and an amplification operation are exchanged as needed.

From the on operation as a switch, the transistor M5 controls the amplification operation, in particular, controls the gate potential, drain potential, and source potential of the transistor to set the bias currents, thereby making it possible to adjust the gain. As a result, it is possible to achieve a directional coupler in which an equivalent degree of coupling is adjustable and the unnecessary loss may be easily suppressed.

The transistor M5 is provided at a location farthest from a sub-line CL. Accordingly, it is possible to compensate for all the loss generated in a signal inputted from an input/output terminal P1 on a side near the sub-line CL during transmission via the switches S1, S4, by the amplification operation of the transistor M5. At this time, since the power included in the signal becomes small due to an influence of the loss, a possibility that a signal that exceeds an operable range of linear operation of the transistor M5 is input to the transistor M5, is further lowered, thereby making it possible to compensate for the loss by performing the amplification operation with low distortion.

On the other hand, when the loss is not intentionally amplified, input return loss of the directional coupler may be improved by the loss in the variable gain circuit 6, and the degree of coupling of the directional coupler may be equivalently lowered.

In the variable gain circuit according to embodiments of the present disclosure, the transistor may be a field effect transistor (FET). In this case, a first signal terminal and a second signal terminal correspond to one and the other one of a source and a drain of the transistor, respectively, and a control terminal corresponds to a gate.

According to the configuration described above, the gate of the transistor is set to a voltage corresponding to a third variable voltage via a third impedance element by isolating (not connecting) the gate of the transistor and a reference voltage terminal by using a first switch. With this, the transistor functions as a switch, and performs an on operation and an off operation. In the on operation, a signal is transmitted between the first signal terminal and the second signal terminal with a small gain (for example, no gain) as compared to the time of amplification. The on operation and the off operation as a switch are switched in accordance with the third variable voltage.

Further, by connecting the gate of the transistor and the reference voltage terminal by using the first switch, the gate of the transistor is set to a fixed voltage via the first switch. In other words, the gate of the transistor is AC-grounded. With this, the transistor functions as a common-gate amplifier, and performs a signal amplification operation in which the source is taken as input and the drain is taken as output. Whether or not one of the first signal terminal and the second signal terminal is made to be the source and whether or not the other one thereof is made to be the drain, are determined in accordance with a first variable voltage and a second variable voltage. That is, the transistor is able to perform a bidirectional amplification operation.

As a result, it is possible to obtain a variable gain circuit that is small in size and is able to perform a bidirectional amplification operation, where an on operation and an off operation as a switch (operation to switch between flowing and cutting off a signal) and a bidirectional amplification operation may be performed by one transistor.

Thus far, the variable gain circuit, the high frequency switch using the variable gain circuit, the high frequency functional circuit, and the directional coupler according to embodiments of the present disclosure have been described based on the embodiments. However, the present disclosure is not limited to the individual embodiments. Without necessarily departing from the spirit of the present disclosure, modes in which various modifications conceivable by those skilled in the art are made to the embodiments, and modes that are constructed by combining constituent elements in the different embodiments may also be included in the scope of one or more aspects of the present disclosure.

INDUSTRIAL APPLICABILITY

The present disclosure may be widely used in wireless devices, such as a mobile terminal device, as a variable gain circuit that is small in size and is able to perform an on operation and an off operation as a switch, and a bidirectional amplification operation.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A variable gain circuit comprising:
   a first input/output terminal and a second input/output terminal configured to input/output a high frequency signal;
   a transistor having a first signal terminal connected to the first input/output terminal, a second signal terminal connected to the second input/output terminal, and a control terminal;
   a first bias terminal having a first variable voltage, a second bias terminal having a second variable voltage, a third bias terminal having a third variable voltage, and a reference voltage terminal having a fixed voltage, the first, second, and third variable voltages and the fixed voltage being independent of each other;
   a first impedance element connected between the first bias terminal and the first signal terminal;
   a second impedance element connected between the second bias terminal and the second signal terminal;
   a third impedance element connected between the third bias terminal and the control terminal; and
   a first switch configured to selectively connect the reference voltage terminal to the control terminal.

2. The variable gain circuit according to claim 1, further comprising:
   a first capacitor connected between the first input/output terminal and the first signal terminal;
   a second capacitor connected between the second input/output terminal and the second signal terminal; and
   a first series circuit comprising a third capacitor and a second switch connected in series,
   wherein the first series circuit is connected in parallel with the first capacitor or the second capacitor.

3. The variable gain circuit according to claim 1, wherein the first impedance element or the second impedance element is an inductor.

4. The variable gain circuit according to claim 3, wherein the inductor is a variable inductor.

5. The variable gain circuit according to claim 1, further comprising:
   a second series circuit comprising a fourth capacitor and a third switch connected in series,
   wherein the second series circuit is connected between a fixed voltage terminal, and the first signal terminal or the second signal terminal.

6. The variable gain circuit according to claim 2, further comprising:
   a second series circuit comprising a fourth capacitor and a third switch connected in series,
   wherein the second series circuit is connected between a fixed voltage terminal, and the first signal terminal or the second signal terminal.

7. The variable gain circuit according to claim 1, further comprising:
   a fifth capacitor connected between the reference voltage terminal and the first switch.

8. The variable gain circuit according to claim 2, further comprising:
a fifth capacitor connected between the reference voltage terminal and the first switch.

9. The variable gain circuit according to claim 5, further comprising:
a fifth capacitor connected between the reference voltage terminal and the first switch.

10. The variable gain circuit according to claim 1, wherein the first switch is further configured to selectively connect the third bias voltage to the control terminal.

11. The variable gain circuit according to claim 2, wherein the first switch is further configured to selectively connect the third bias voltage to the control terminal.

12. The variable gain circuit according to claim 5, wherein the first switch is further configured to selectively connect the third bias voltage to the control terminal.

13. The variable gain circuit according to claim 7, wherein the first switch is further configured to selectively connect the third bias voltage to the control terminal.

14. A high frequency switch comprising:
at least one variable gain circuit according to claim 1; and
at least two second transistors cascade-connected with the transistor of the variable gain circuit,
wherein the transistor of the variable gain circuit is not at an end of the cascading connection.

15. A high frequency switch comprising:
at least one variable gain circuit according to claim 2; and
at least two second transistors cascade-connected with the transistor of the variable gain circuit,
wherein the transistor of the variable gain circuit is not at an end of the cascading connection.

16. A high frequency switch comprising:
at least one variable gain circuit according to claim 5; and
at least two second transistors cascade-connected with the transistor of the variable gain circuit,
wherein the transistor of the variable gain circuit is not at an end of the cascading connection.

17. A high frequency switch comprising:
at least one variable gain circuit according to claim 7; and
at least two second transistors cascade-connected with the transistor of the variable gain circuit,
wherein the transistor of the variable gain circuit is not at an end of the cascading connection.

18. A high frequency switch comprising:
at least one variable gain circuit according to claim 10; and
at least two second transistors cascade-connected with the transistor of the variable gain circuit,
wherein the transistor of the variable gain circuit is not at an end of the cascading connection.

19. The variable gain circuit according to claim 1, configured to switch and perform:
a bidirectional amplification operation,
a signal flow operation without amplification, and
a signal cut-off operation between a first input/output terminal and a second input/output terminal.

* * * * *